(12) United States Patent
Blalock et al.

(10) Patent No.: US 7,119,031 B2
(45) Date of Patent: Oct. 10, 2006

(54) METHODS OF FORMING PATTERNED PHOTORESIST LAYERS OVER SEMICONDUCTOR SUBSTRATES

(75) Inventors: Guy T. Blalock, Boise, ID (US); Gurtej S. Sandhu, Boise, ID (US); Jon P. Daley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 152 days.

(21) Appl. No.: 10/879,367

(22) Filed: Jun. 28, 2004

(65) Prior Publication Data

US 2005/0287816 A1    Dec. 29, 2005

(51) Int. Cl.
*H01L 21/31* (2006.01)

(52) U.S. Cl. ........................................ 438/758; 438/72

(58) Field of Classification Search ................ 438/72, 438/758, 787, 636
See application file for complete search history.

(56) References Cited

U.S. PATENT DOCUMENTS

| | | | |
|---|---|---|---|
| 3,349,474 A | 10/1967 | Rauscher | |
| 3,772,101 A | 11/1973 | Chumbres et al. | |
| 4,086,074 A | 4/1978 | Minot et al. | |
| 4,622,735 A | 11/1986 | Shibata | |
| 4,683,645 A | 8/1987 | Naguib et al. | |
| 4,693,910 A | 9/1987 | Nakajima et al. | |
| 4,766,090 A | 8/1988 | Coquin et al. | |
| 5,099,304 A | 3/1992 | Takemura et al. | |
| 5,236,865 A | 8/1993 | Sandhu et al. | |
| 5,406,123 A | 4/1995 | Narayan | 257/767 |
| 5,444,024 A | 8/1995 | Anjum et al. | |
| 5,470,784 A | 11/1995 | Coleman | 437/101 |
| 5,470,794 A | 11/1995 | Anjum | 437/200 |
| 5,670,298 A | 9/1997 | Hur | |
| 5,677,102 A | 10/1997 | Shiihara | |
| 5,904,517 A | 5/1999 | Gardner et al. | 438/197 |
| 5,955,244 A | 9/1999 | Duval | |
| 5,994,194 A | 11/1999 | Lammert | |
| 5,998,264 A | 12/1999 | Wu | 438/260 |
| 6,013,582 A | 1/2000 | Ionov et al. | |
| 6,037,239 A | 3/2000 | Jennings | |
| 6,096,621 A | 8/2000 | Jennings | |
| 6,096,634 A | 8/2000 | Nguyen | |
| 6,130,140 A | 10/2000 | Gonzalez | |
| 6,133,105 A | 10/2000 | Chen et al. | |
| 6,133,116 A | 10/2000 | Kim et al. | |

(Continued)

FOREIGN PATENT DOCUMENTS

EP      0 851 473 A2    1/1998

(Continued)

OTHER PUBLICATIONS

U.S. Appl. No. 10/932,218, filed Sep. 1, 2004, Basceri et al.

(Continued)

*Primary Examiner*—Roy Potter
(74) *Attorney, Agent, or Firm*—Wells St. John P.S.

(57) ABSTRACT

This invention includes methods of forming patterned photoresist layers over semiconductor substrates. In one implementation, a porous antireflective coating is formed over a semiconductor substrate. A photoresist footer-reducing fluid is provided within pores of the porous antireflective coating. A positive photoresist is formed over the porous antireflective coating having the fluid therein. The positive photoresist is patterned and developed to form a patterned photoresist layer, with the fluid within the pores being effective to reduce photoresist footing in the patterned photoresist layer than would otherwise occur in the absence of the fluid within the pores. Other aspects and implementations are contemplated.

64 Claims, 5 Drawing Sheets

U.S. PATENT DOCUMENTS

| | | | |
|---|---|---|---|
| 6,156,674 A | 12/2000 | Li et al. | |
| 6,165,834 A | 12/2000 | Agarwal et al. | |
| 6,177,235 B1 | 1/2001 | Francou et al. | |
| 6,180,465 B1 | 1/2001 | Gardner et al. | 438/291 |
| 6,188,097 B1 | 2/2001 | Derderian et al. | |
| 6,194,304 B1 * | 2/2001 | Morozumi et al. | 438/618 |
| 6,207,485 B1 | 3/2001 | Gardner et al. | 438/216 |
| 6,238,994 B1 | 5/2001 | Derderian et al. | |
| 6,255,035 B1 | 7/2001 | Minter et al. | |
| 6,277,709 B1 | 8/2001 | Wang et al. | |
| 6,277,728 B1 | 8/2001 | Ahn et al. | |
| 6,281,100 B1 | 8/2001 | Yin et al. | |
| 6,291,363 B1 | 9/2001 | Yin et al. | |
| 6,297,527 B1 | 10/2001 | Agarwal et al. | |
| 6,350,560 B1 | 2/2002 | Sahbari | 430/325 |
| 6,376,149 B1 | 4/2002 | Grober et al. | |
| 6,380,611 B1 | 4/2002 | Yin et al. | |
| 6,383,723 B1 | 5/2002 | Iyer et al. | |
| 6,399,982 B1 | 6/2002 | Derderian et al. | |
| 6,440,793 B1 | 8/2002 | Divakaruni et al. | |
| 6,465,325 B1 | 10/2002 | Ridley et al. | |
| 6,511,896 B1 | 1/2003 | Basceri et al. | |
| 6,548,854 B1 | 4/2003 | Kizilyalli et al. | 257/310 |
| 6,582,861 B1 | 6/2003 | Buxbaum et al. | |
| 6,582,888 B1 | 6/2003 | Herbst et al. | |
| 6,608,343 B1 | 8/2003 | Derderian et al. | |
| 6,613,240 B1 | 9/2003 | Skinner et al. | |
| 6,617,250 B1 | 9/2003 | Basceri et al. | |
| 6,649,466 B1 | 11/2003 | Basceri et al. | |
| 6,720,638 B1 | 4/2004 | Tran | |
| 6,744,093 B1 | 6/2004 | Agarwal et al. | |
| 6,746,916 B1 | 6/2004 | Agarwal et al. | |
| 6,753,618 B1 | 6/2004 | Basceri et al. | 257/915 |
| 6,777,739 B1 | 8/2004 | Agarwal et al. | |
| 6,780,728 B1 | 8/2004 | Tran | |
| 6,780,766 B1 | 8/2004 | Basceri et al. | |
| 6,817,086 B1 | 11/2004 | Lu et al. | |
| 6,838,363 B1 | 1/2005 | Wieczorek et al. | |
| 6,844,131 B1 | 1/2005 | Oberlander et al. | 430/270.1 |
| 6,900,497 B1 | 5/2005 | Agarwal et al. | |
| 6,956,980 B1 | 10/2005 | Nagata et al. | |
| 2001/0006759 A1 | 7/2001 | Shipley, Jr. et al. | |
| 2002/0076879 A1 | 6/2002 | Lee et al. | |
| 2002/0196651 A1 | 12/2002 | Weis | |
| 2003/0013272 A1 | 1/2003 | Hong et al. | |
| 2003/0045060 A1 | 3/2003 | Ahn et al. | 438/287 |
| 2003/0045078 A1 | 3/2003 | Ahn et al. | 438/585 |
| 2003/0205729 A1 | 11/2003 | Basceri et al. | 257/200 |
| 2003/0213987 A1 | 11/2003 | Basceri et al. | 257/296 |
| 2003/0219942 A1 | 11/2003 | Choi et al. | 438/253 |
| 2004/0043228 A1 | 3/2004 | Derderian et al. | 428/446 |
| 2004/0046197 A1 | 3/2004 | Basceri et al. | 257/296 |
| 2004/0245559 A1 | 12/2004 | Pontoh et al. | 257/306 |
| 2004/0245560 A1 | 12/2004 | Pontoh et al. | 257/309 |
| 2005/0244571 A1 * | 11/2005 | Walheim et al. | 427/162 |

FOREIGN PATENT DOCUMENTS

| | | |
|---|---|---|
| JP | 2002-323775 | 11/2002 |

OTHER PUBLICATIONS

Chang et al., Silicon surface treatments in advanced MOS gate processing, Microelectronic Engineering, (2004), pp. 130-135.

Lemberger et al., Electrical characterization and reliability aspects of zirconium silicate films obtained from novel MOCVD precursors, Microelectronic Engineering (2004), pp. 315-320.

Lu et al., Effects of the $TaN_x$ interface layer on doped tantalum oxide high-κ films, VACUUM (2004), pp. 1-9.

Robertson et al., Atomic structure, band offsets, growth and defects at high-κ oxide:Si enterfaces, Microelectronic Engineering (2004) pp. 112-120.

Singh et al., High and Low Dielectric Constant Materials, The Electrochemical Society *Interface*, Summer 1999, pp. 26-30.

ABSTRACT: Basceri et al., Atomic Layer Deposition for Nanoscale CU Metalization, 10 pages (pre-Apr. 2004).

En et al., Plasma immersion ion implantation reactor design considerations for oxide charging, 85 Surface and Coatings Technology 64-69 (1966).

Ku et al., The Application of Ion Beam Mixing, Doped Silicide, and Rapid Thermal Processing of Self-Aligned Silicide Technology, 137 J. Electrochem. Soc. No. 2, pp. 728-740 (Feb. 1990).

U.S. Appl. No. 10/609,311, filed Jun. 2003, Yates.
U.S. Appl. No. 10/655,997, filed Sep. 2003, Daley.
U.S. Appl. No. 10/689,958, filed Oct. 2003, Basceri.
U.S. Appl. No. 10/690,029, filed Oct. 2003, Derderian et al.
U.S. Appl. No. 10/822,118, filed Apr. 2004, Sandhu et al.

COB Stack DRAM Cell Technology beyond 100 nm Technology Node; Yongjik Park & Kinam Kim; pp. 349.1-349.3.

Rubin et al., Shallow-Junction Diode Formation by implantation of Arsenic and Boron Through Titanium-Silicide Films and . . . , 17 IEEE Transactions on Electron Devices, No. 1, pp. 183-190 (Jan. 1990).

* cited by examiner

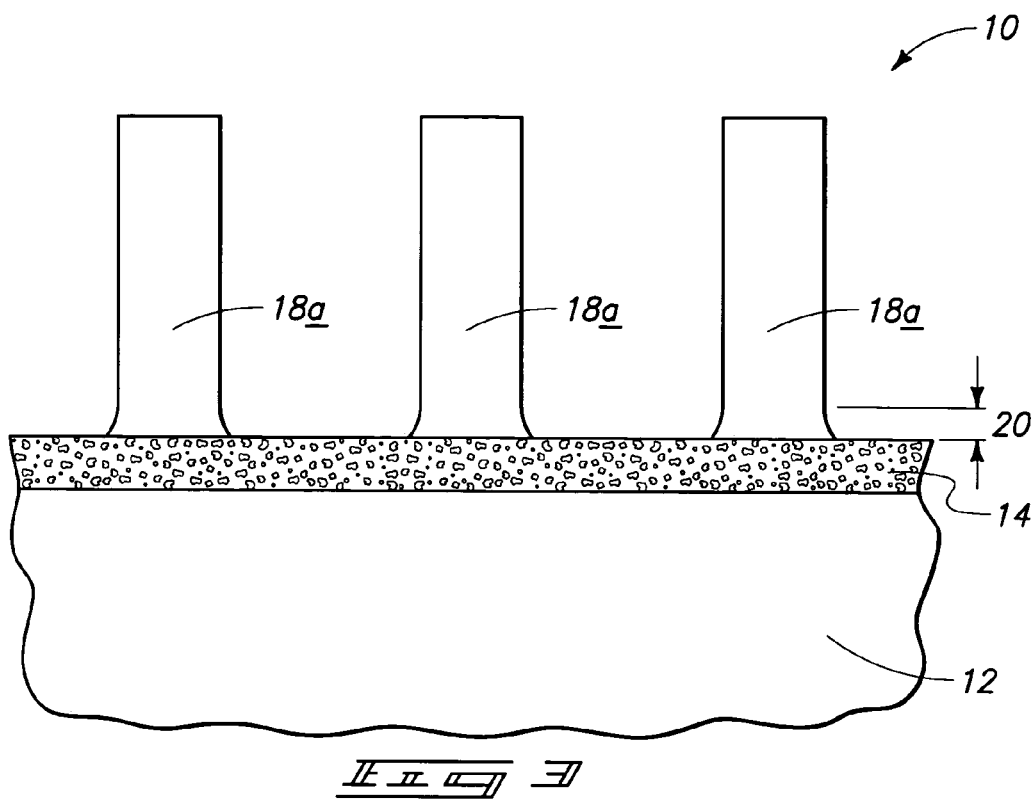
_Fig 3_
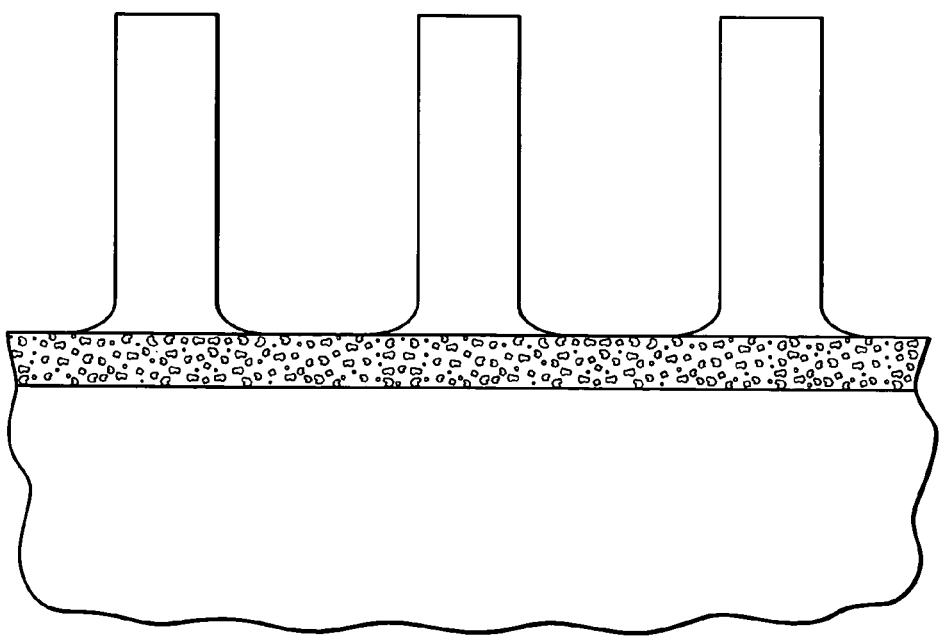
_Fig 4_
_PRIOR ART_

METHODS OF FORMING PATTERNED PHOTORESIST LAYERS OVER SEMICONDUCTOR SUBSTRATES

TECHNICAL FIELD

This invention relates to methods of forming patterned photoresist layers over semiconductor substrates.

BACKGROUND OF THE INVENTION

A continuing goal in semiconductor processing is increased miniaturization while maintaining high performance. Modern semiconductor processes are still heavily reliant on photolithography when fabricating semiconductor circuitry to achieve this goal.

Photolithography is a commonly-used method for patterning features during semiconductor processing. A radiation-sensitive material (i.e., photoresist) is formed over a substrate which is ultimately to be patterned, for example by etching or ion implanting. The photoresist is subsequently subjected to radiation which modifies the solubility of the impacted versus the unimpacted regions in a suitable developer solution. Accordingly, the radiation is provided in a desired pattern so that some portions of the photoresist are impacted by the radiation while other portions of the photoresist are not impacted by the radiation. The photoresist is then subjected to developing conditions which selectively remove either the impacted or the non-impacted portions. Photoresists are typically designed to be either negative or positive. If the photoresist is a positive photoresist, the impacted portions are selectively removed. If the photoresist is a negative photoresist, the non-impacted portions are selectively removed.

The photoresist remaining after development defines a patterned mask. The pattern of such mask can subsequently be transferred to the underlying material using appropriate etching and/or implanting techniques to form patterned features in material beneath the mask. A difficulty which can be encountered during photolithographic processing is that the radiation utilized to pattern the photoresist can be reflected from the underlying layer or layers to cause various constructive and destructive interference patterns to occur. This can adversely affect the pattern ultimately developed in the photoresist.

One manner of addressing the reflective issues is to initially form an antireflective coating over the layer or layers to be patterned, and then forming a layer of photoresist thereover. Further, multiple antireflective coating materials or layers might be utilized, as well as multiple layers of resist and/or non-radiation sensitive hard masking or other layers. Various antireflective coating materials have been developed. Some are principally organic in nature, while others are principally inorganic in nature. DARC, which stands for Deposited Antireflective Coating, is typically understood within the industry to define inorganic antireflective coatings formed of silicon, oxygen, nitrogen and sometimes hydrogen. Another commonly used class of antireflective coating is BARC, which stands for Bottom Antireflective Coating. BARC materials are principally organic in nature.

The continuing goal and effect of circuitry miniaturization has typically resulted in greater reduction in the horizontal dimension as compared to the vertical dimension. In the etching of features, this has resulted in narrower yet correspondingly increasing height in the features being formed, something typically referred to as increasing aspect ratio. Correspondingly, the photoresist masks utilized to form such features typically also have increased aspect ratios. Accordingly, adherence of the photoresist to the underlying antireflective coating or other layers takes on increasing significance towards precluding displacement or toppling of the masking blocks formed in the patterned photoresist. Further and regardless, the photoresist and antireflective coating materials can interact, particularly during a post-exposure bake of the photoresist prior to solvent development. For example, material at the outer surface of the antireflective coating materials can migrate into the photoresist, and/or the photoresist can interact with material on the outer surface of the antireflective coating which can, one or both, adversely affect adherence or desired control in the ultimate pattern produced in the photoresist.

In most instances, it is highly desirable that the photoresist masking blocks which are formed have substantially vertical sidewalls from top to bottom of the photoresist layer. However, the patterned photoresist can tend to flare out at the bottom/bases of the individual masking blocks forming what is commonly referred to as footing. The degree of footing can be exacerbated by use of certain antireflective coatings, principally the result of interaction between the photoresist and outer surface of the antireflective coating. Further in some instances, the patterned photoresist can tend to recess in at the bottom/bases of the individual masking blocks which can lead to collapse/toppling of portions of the mask and/or less than desired transfer of the mask pattern to underlying layers.

While the invention was motivated in addressing the above-identified issues, it is in no way so limited. The invention is only limited by the accompanying claims as literally worded, without interpretative or other limiting reference to the specification, and in accordance with the doctrine of equivalents.

SUMMARY

This invention comprises methods of forming patterned photoresist layers over semiconductor substrates. In one implementation, a porous antireflective coating is formed over a semiconductor substrate. A photoresist footer-reducing fluid is provided within pores of the porous antireflective coating. A positive photoresist is formed over the porous antireflective coating having the fluid therein. The positive photoresist is patterned and developed to form a patterned photoresist layer, with the fluid within the pores being effective to reduce photoresist footing in the patterned photoresist layer than would otherwise occur in the absence of the fluid within the pores.

In one implementation, a method of forming a patterned photoresist layer over a semiconductor substrate includes forming a porous antireflective coating over a semiconductor substrate. A photoresist base-widening fluid is provided within pores of the porous antireflective coating. A positive photoresist is formed over the porous antireflective coating having the fluid therein. The positive photoresist is patterned and developed to form a patterned photoresist layer, with the fluid within the pores being effective to widen a base of the patterned photoresist adjacent the antireflective coating than would otherwise occur in the absence of the fluid within the pores.

In one implementation, a method of forming a patterned photoresist layer over a semiconductor substrate includes forming a porous antireflective coating over a semiconductor substrate. A liquid comprising material is provided within pores of the porous antireflective coating. Photoresist is formed over the porous antireflective coating having the liquid comprising material therein. The photoresist is patterned and developed over the porous antireflective coating having the liquid comprising material therein to form a patterned photoresist layer.

In one implementation, a method of forming a patterned photoresist layer over a semiconductor substrate includes forming a porous antireflective coating over a semiconductor substrate. A fluid is provided within pores of the porous antireflective coating. The fluid comprises at least one of a photoacid generator, a photobase generator, a pH buffer, and hexamethyldisalizane. Photoresist is formed over the porous antireflective coating having the fluid therein. The photoresist is patterned and developed over the porous antireflective coating having the fluid therein to form a patterned photoresist layer.

Other aspects and implementations are contemplated.

BRIEF DESCRIPTION OF THE DRAWINGS

Preferred embodiments of the invention are described below with reference to the following accompanying drawings.

FIG. 3 is a view of the FIG. 2 substrate fragment at a processing step subsequent to that shown by FIG. 2.

FIG. 4 is a diagrammatic, cross-sectional, fragmentary view of a prior art semiconductor substrate processed in contrast to the FIG. 3 substrate fragment.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
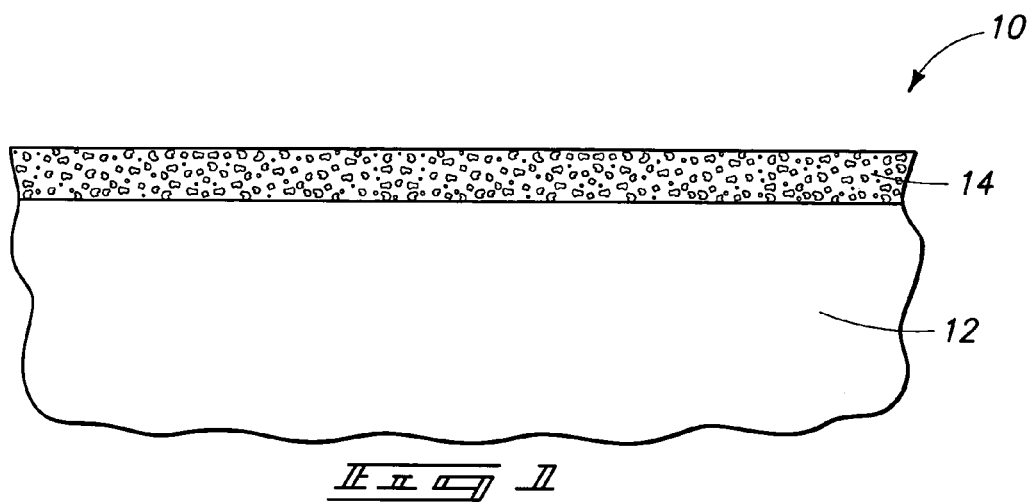
FIG. 1 is a diagrammatic, cross-sectional, fragmentary view of a semiconductor substrate in process in accordance with an aspect of the invention.
Figure 2:
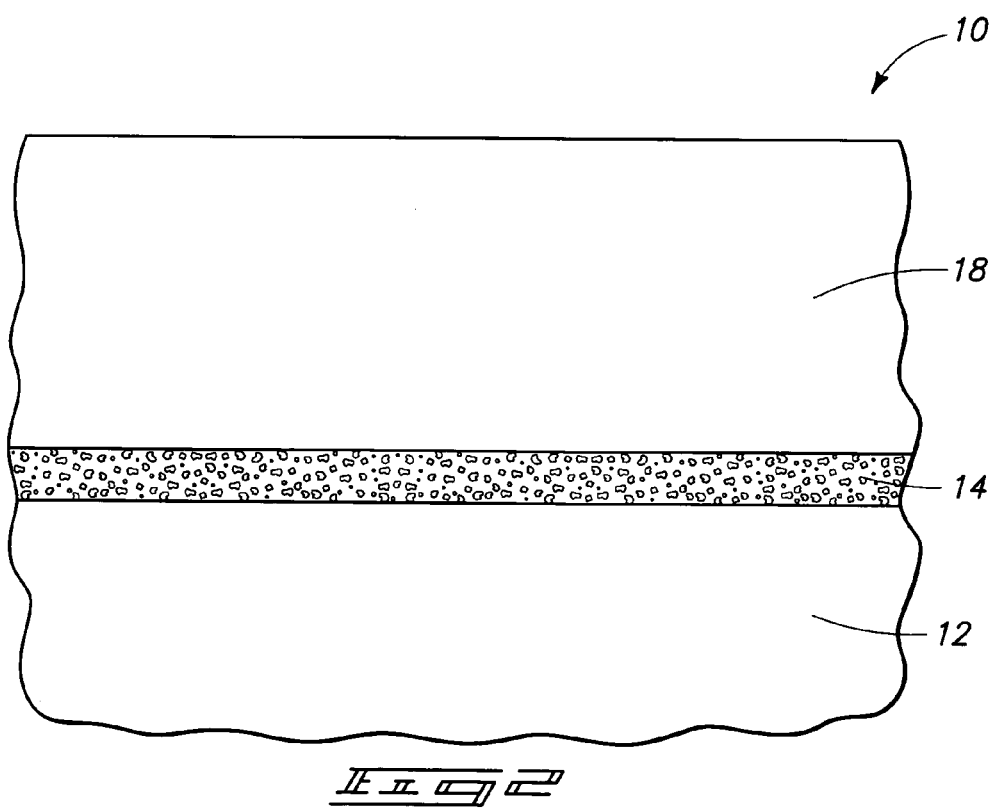
FIG. 2 is a view of the FIG. 1 substrate fragment at a processing step subsequent to that shown by FIG. 1.

A method of forming a patterned photoresist layer over a semiconductor substrate is described initially with reference to an exemplary embodiment as depicted in FIGS. 1–3. Referring initially to FIG. 1, a wafer fragment 10 comprises a semiconductor substrate 12. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Further, the term "layer" encompasses the singular and the plural unless otherwise indicated. Accordingly, semiconductor substrate 12 might comprise multiple different materials and/or layers which may include, by way of example only, bulk semiconductor materials and/or semiconductor-on-insulator layers.

A porous antireflective coating 14 has been formed over semiconductor substrate 12. An exemplary preferred thickness range for coating 14 is from about 100 Angstroms to about 500 Angstroms. Porous antireflective coating 14 might be organic, inorganic, or a combination of organic and inorganic material and layers. Exemplary preferred inorganic porous antireflective coatings comprise siliconoxynitrides (i.e., $Si_xO_yN_z$) as well as porous silicon dioxide. Further, organic and inorganic oxides are also contemplated. Exemplary organic porous antireflective coatings comprise acrylate polymers, SiLK available from Dow Chemical of Midland, Mich., GX-3p available from Honeywell of Sunnyvale, Calif., porous low-k SiOC and foamed methylsilsesquioxane. Alternately considered or in addition thereto, examples include low k films deposited by plasma enhanced chemical vapor deposition, for example spin-on porous $SiO_2$ and/or xerogel materials. Further by way of example only, exemplary porous inorganic materials that can have antireflective properties include Nanoglass™ spin-on dielectrics available from Honeywell of Sunnyvale, Calif., as well as materials, by way of example only, as disclosed in U.S. Pat. No. 4,693,910 to Nakajima et al. Accordingly, porous antireflective coatings have been utilized in the prior art, but not in the context as herein described and as claimed.

In one aspect of the invention, a photoresist footer-reducing fluid is provided within pores of porous antireflective coating 14. In the context of this document, a "photoresist footer-reducing fluid" has the effect of reducing footing in photoresist as described subsequently. The footer-reducing fluid might be entirely gaseous, primarily gaseous, entirely liquid, primarily liquid, including a mixture of gaseous and liquid phases. By way of example only, examples include photoacid generators. Further by way of example only, specific exemplary photoacid generators include, Bis(4-tert-butylpheny)iodonium perfluoro-1-butanesulfonate;
Bis(4-tert-butylphenyl)iodoniump-toluenesulfonate;
Bis(4-tert-butylpheny)iodonium triflate;
(4-Bromophenyl)diphenylsulfonium triflate;
(tert-Butoxycarbonylmethoxynaphthyl)-diphenylsulfan triflate;
(tert-Butoxycarbonylmethoxpheny)diphenysulfonium triflate;
(4-tert-Butylphenyl)diphenylsulfonium triflate;
(4-Chlorophenyl)diphenylsulfonium triflate;
Diphenyliodonium hexafluorophosphate;
Diphenyliodonium nitrate;
Diphenyliodonium perfluoro-1-butanesulfonate;
Diphenyliodoniump-toluenesulfonate;
Diphenyliodonium triflate;
(4-Fluorophenyl)diphenylsulfonium triflate;
N-Hydroxynaphthalimide triflate;
N-Hydroxy-5-norbornene-2,3-dicarboximide perfluoro-1-butanesulfonate;
N-Hydroxyphthalimide triflate;
(4-Iodophenyl)diphenylsulfonium triflate);
(4-Methoxyphenyl)diphenylsulfonium triflate;
(4-Methylphenyl)diphenylsulfonium triflate;

(4-Methylthiophenyl)methyl phenyl sulfonium triflate;
2-Naphthyl diphenylsulfonium triflate;
(4-Phenoxyphenyl)diphenylsulfonium triflate;
(4-Phenylthiophenyl)diphenylsulfonium triflate;
Triphenylsulfonium perfluoro-1-butanesulfonate;
Triphenylsulfonium triflate;
Tris(4-tert-butylphenyl)sulfonium perfluoro-1-butanesulfonate; and
Tris(4-tert-butylphenyl)sulfonium triflate.

Further by way of example only, an alternate exemplary class of footer-reducing fluids comprises acid pH buffers, for example 2-(N-Morpholino)ethanesulfonic acid having an exemplary pKa of 6.1.

The footer-reducing fluid might be provided within the pores during the actual formation of the porous antireflective coating over the substrate, or after such coating has been formed. For example where the footer-reducing fluid is primarily gaseous, an exemplary method of providing the footer-reducing fluid within the pores would include exposing the substrate having the porous antireflective coating to an environment comprising the gaseous material for a suitable period of time effective to incorporate the gas within the pores. Alternately, a gaseous footer-reducing fluid might be provided in the pores during formation of the porous layer itself, for example during formation by chemical vapor deposition or otherwise. In one more preferred embodiment, the footer-reducing fluid is primarily liquid and provided within the pores after forming the porous antireflective coating over the substrate. By way of example only, one preferred technique for doing so comprises soaking the substrate with porous antireflective coating within a bath containing the footer-reducing liquid. Alternately by way of example only, another technique includes puddling the footer-reducing liquid onto the porous antireflective coating.

Referring to FIG. 2, a positive photoresist 18 has been formed over porous antireflective coating 14 having the footer-reducing fluid therein. An exemplary photoresist material comprises AR360 available from the Shipley Company of Marlborough, Mass. As with layer 14, any desired suitable thickness can be utilized. By way of example, an exemplary thickness range for layer 18 is from 2000 Angstroms to 3350 Angstroms.

Referring to FIG. 3, positive photoresist 18 has been patterned and developed effective to form a patterned photoresist layer 18a. As depicted, layer 18a can be considered as having a base region 20 where footing may or may not occur. In accordance with one aspect of the invention, the fluid within the pores is effective to reduce photoresist footing in the patterned photoresist layer than would otherwise occur in the absence of the fluid within the pores. For example, FIG. 4 depicts a prior art construction identical to the FIG. 3 construction and processed identically in accordance therewith but for the inclusion/provision of a photoresist footer-reducing fluid within pores of the porous antireflective coating. FIG. 3 depicts reduced photoresist footing than what occurs relative to the FIG. 4 processing. Patterning and developing might, of course, be by any existing or yet-to-be developed methods. Further in the context of this document, reduced footing encompasses an absence of any footing.

Figure 5:
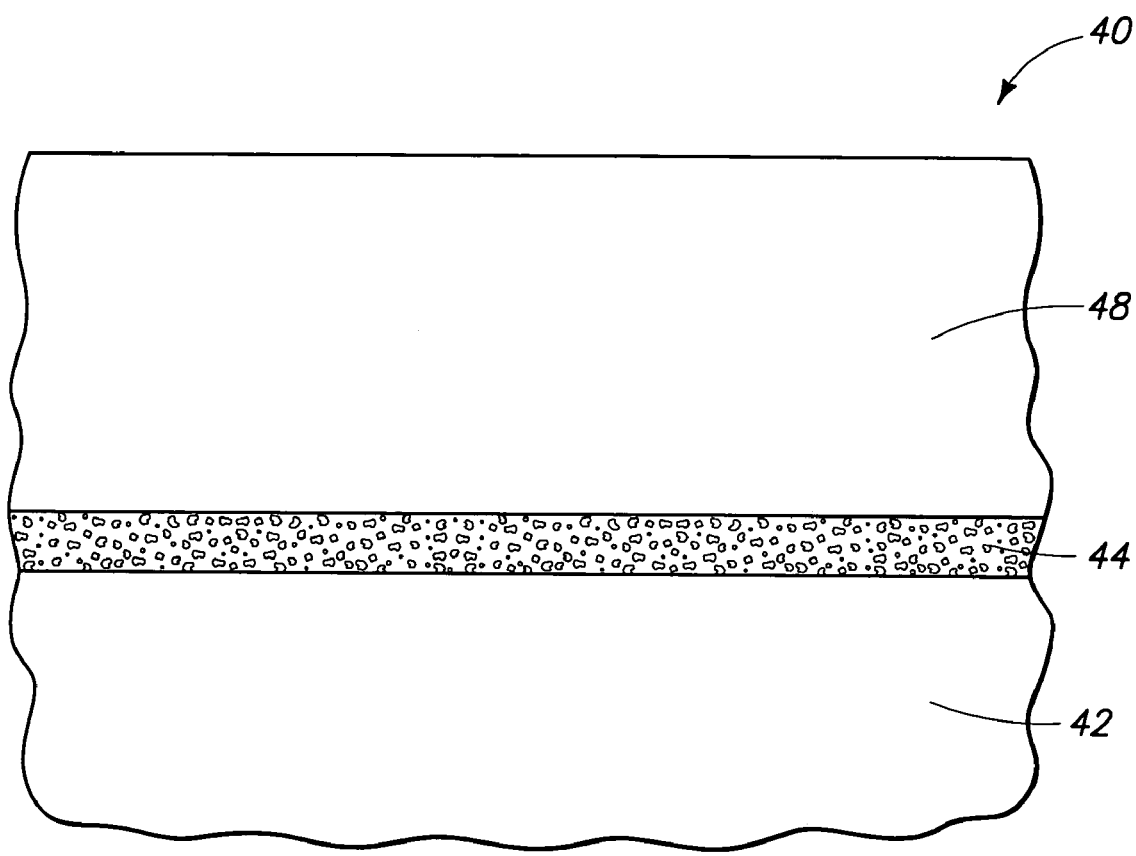
FIG. 5 is a diagrammatic, cross-sectional, fragmentary view of an alternate embodiment semiconductor substrate in process in accordance with an aspect of the invention.

By way of example only, an alternate method of forming a patterned photoresist layer over a semiconductor substrate is described in conjunction with FIGS. 5–9. Referring initially to FIG. 5, a semiconductor substrate fragment in process is indicated generally with reference numeral 40, and comprises a semiconductor substrate 42. Preferred attributes thereof are as described above with respect to semiconductor substrate 12. A porous antireflective coating 44 is formed over semiconductor substrate 42. Attributes of porous antireflective coating 44 are preferably as described above with respect to porous antireflective coating 14. However in this particular embodiment, a photoresist base-widening fluid is provided within the pores of antireflective coating 44. By way of example only, an exemplary photoresist base-widening fluid includes a photobase generator. By way of example only, exemplary photobase generators include photoactive carbamates, including benzyl carbamates and benzoin carbamates. And further by way of example only, specific preferred organic based generators include, 2-hydroxy-2-phenylacetophenone N-cyclohexyl carbamate [i.e., $(C_6H_5C(=O)CH(C_6H_5)OC(=O)NHC_6H_{11}]$;
o-nitrobenzyl N-cyclohexyl carbamate [i.e., $o\text{-}NO_2C_6H_5CH_2OC(=O)NHC_6H_{11}]$;
N-cyclohexyl-2-naphthalene sulfonamide [i.e., $C_{10}H_7SO_2NHC_6H_{11}]$;
3,5-dimethoxybenzyl N-cyclohexyl carbamate [i.e., $(CH_3O)_2C_6H_5CH_2OC(=O)NHC_6H_{11}]$;
N-cyclohexyl p-toluene sulfonamide [i.e., $p\text{-}CH_3C_6H_5SO_2NHC_6H_{11}]$; and
dibenzoin isophorone dicarbamate.

Further by way of example only, an alternate class of base-widening fluids comprises basic pH buffers, with triethanolamine having a pKa 7.8 being but one example.

As with the above-described first embodiment, the base-widening fluid might be entirely gaseous, primarily gaseous, entirely liquid, primarily liquid, including a mixture of gaseous and liquid phases. Other attributes for providing the base-widening fluid within the pores are as described above in connection with the first described embodiment.

A positive photoresist 48 has been formed over porous antireflective coating 44 which has the base-widening fluid therein. Preferred attributes of positive photoresist 48 are as described above in connection with the first described embodiment with respect to positive photoresist 18.

Figure 6:
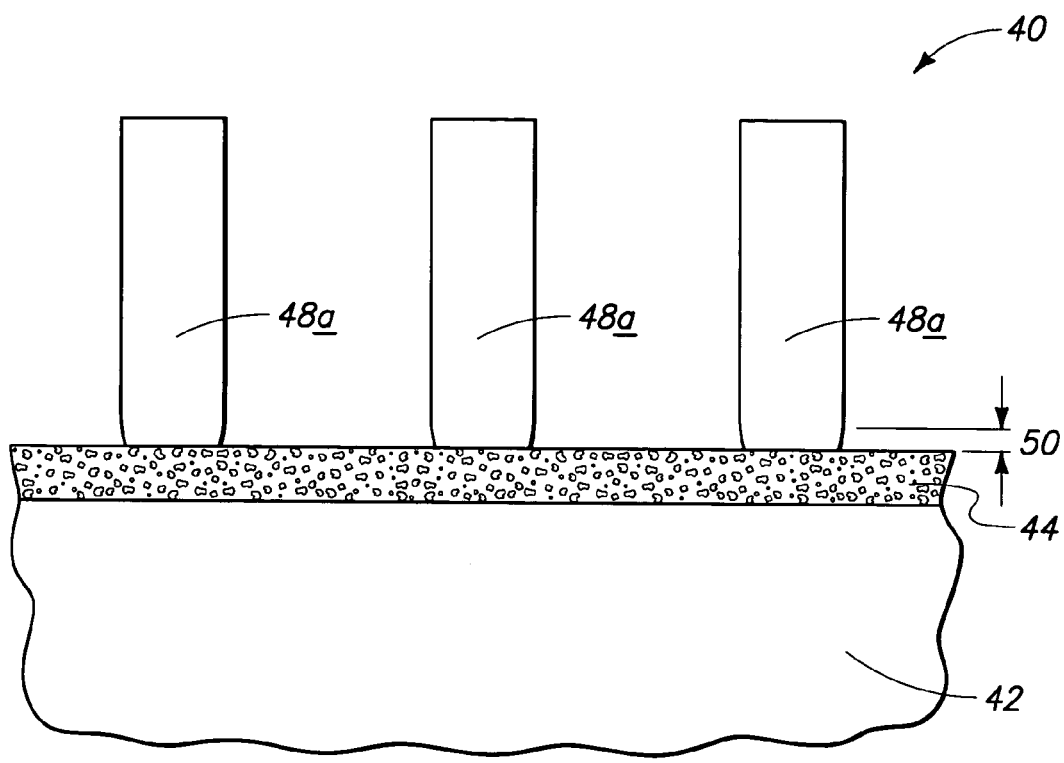
FIG. 6 is a view of the FIG. 5 substrate fragment at a processing step subsequent to that shown by FIG. 5.
Figure 7:
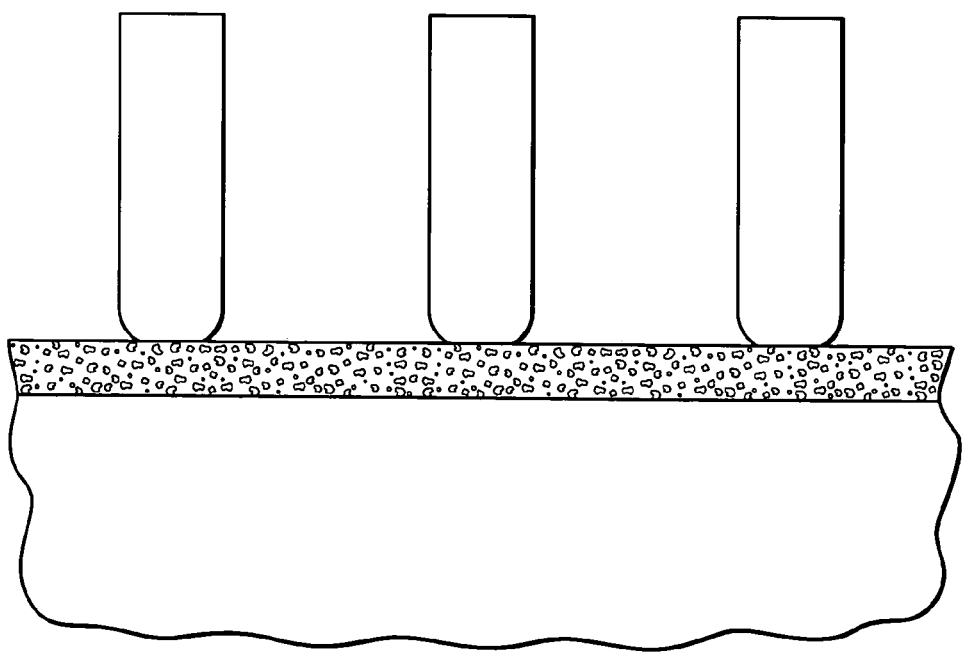
FIG. 7 is a diagrammatic, cross-sectional, fragmentary view of a prior art semiconductor substrate processed in contrast to the FIG. 6 substrate fragment.

Referring to FIG. 6, photoresist 48 has been patterned and developed to form a patterned photoresist layer 48a. As depicted, layer 48a can be considered as having a base region 50 thereof adjacent antireflective coating 44. In accordance with one aspect of the invention, the fluid within the pores is effective to widen a base of the patterned photoresist adjacent the antireflective coating than would otherwise occur in the absence of the fluid within the pores. For example, FIG. 7 depicts a prior art construction identical to the FIG. 6 construction and processed in accordance therewith identically but for providing the base-widening fluid within the pores of the porous antireflective coating. Accordingly, in the depicted exemplary FIG. 7 prior art embodiment, undesired recessing inherently occurs, with processing in accordance with FIG. 6 inherently reducing such recessing to be of a lesser degree. Of course, the base-widening effect by the fluid received within the pores might be effective to produce the sidewalls of the illustrated photoresist masking layer blocks 48a to be entirely vertical, or perhaps even flared outwardly to produce flared photoresist footing.

Figure 8:
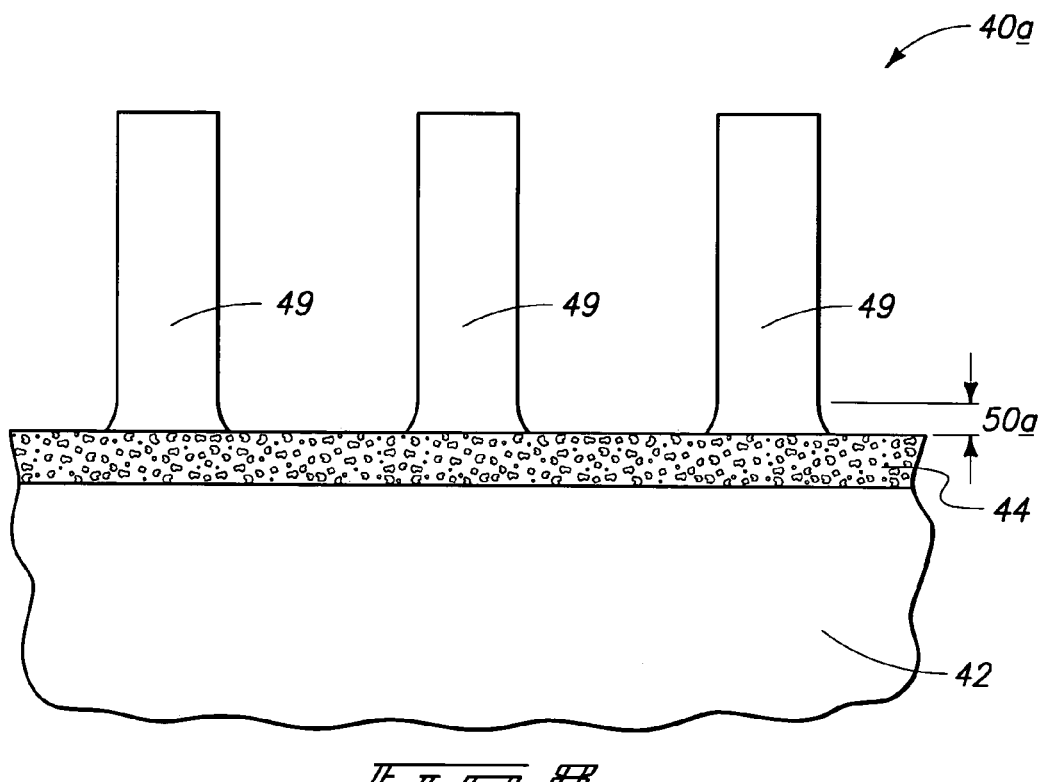
FIG. 8 is a diagrammatic, cross-sectional, fragmentary view of an alternate embodiment semiconductor substrate in process in accordance with an aspect of the invention.
Figure 9:
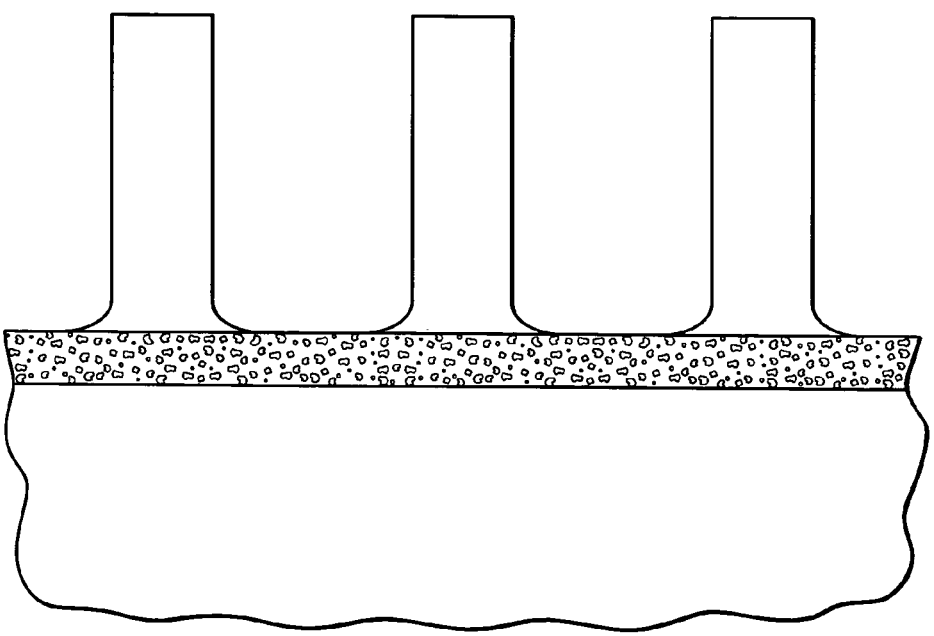
FIG. 9 is a diagrammatic, cross-sectional, fragmentary view of a prior art semiconductor substrate processed in contrast to the FIG. 8 substrate fragment.

For example and by way of example only, FIG. 8 depicts an alternate embodiment semiconductor substrate fragment 40a. Like numerals from the FIGS. 5 and 6 embodiment are utilized where appropriate, with differences being indicated with the suffix "a" or with different numerals. FIG. 8 depicts a patterned photoresist layer 49 corresponding to that of layer 48a in the FIG. 6 embodiment, but whereby the base widening is effective to form laterally flared-out feet of the patterned photoresist layer 49 adjacent antireflective coating 44. For example and by way of example only, FIG. 9 depicts a prior art construction identical to the FIG. 8 construction and processed in accordance therewith identically, but for the provision of photoresist base-widening fluid within pores of the porous antireflective coating. FIG. 9 depicts a greater degree or increased footing than otherwise occurs relative to the FIG. 8 processing. Of course, the prior art FIG. 9 processing might also have included recessing rather than footing of the photoresist masking blocks relative to the depicted base region proximate the porous antireflective coating layer.

The invention was motivated and initially considered in the context of providing a photoresist footer-reducing fluid or a photoresist base-widening fluid within the pores of a porous antireflective coating to be effective to reduce photoresist footing or widen a base in a patterned photoresist adjacent the porous antireflective coating than would otherwise occur in the absence of the fluid within the pores. However, the invention herein disclosed and claimed also contemplates other aspects independent of reducing photoresist footing or photoresist base-widening.

In one aspect of the invention, a method of forming a patterned photoresist layer over a semiconductor substrate comprises forming a porous antireflective coating over a semiconductor substrate. Exemplary preferred attributes are as described in the above embodiments. A liquid comprising material is provided within the pores of the porous antireflective coating. Exemplary materials include those as described above, although the provision of any liquid comprising material within the pores of the porous antireflective coating is contemplated. By way of example only and in preferred embodiments, the liquid might comprise at least one of a photoacid generator, a photobase generator, a small pH buffer, and hexamethyldisalizane. Alternately by way of example, the liquid might comprise at least two, at least three, or more of such stated materials. Further, the invention contemplates other liquid materials combined with these or utilized alone.

Photoresist is provided over the porous antireflective coating having the liquid comprising material therein. The photoresist might comprise a positive photoresist and/or a negative photoresist. The photoresist is patterned and developed over the porous antireflective coating having the liquid comprising material therein to form a patterned photoresist layer, and, for example, independent of any photoresist footer-reducing or photoresist base-widening effect(s). For example and by way of example only with respect to hexamethyldisalizane, such might have the effect of causing better flow of the photoresist to be received with the pores, and thereby perhaps facilitate better photoresist adhesion to the antireflective coating layer than would otherwise occur in the absence of hexamethyldisalizane within such pores.

In one implementation, a method of forming a patterned photoresist layer over a semiconductor substrate comprises forming a porous antireflective coating over a semiconductor substrate. Preferred attributes for such are as described in connection with the above embodiments. A fluid is provided within the pores of the porous antireflective coating. In this implementation, the fluid comprises at least one of a photoacid generator, a photobase generator, a pH buffer, and hexamethyldisalizane. Photoresist is formed over the porous antireflective coating having the fluid therein. Such photoresist is patterned and developed over the porous antireflective coating having the fluid therein to form a patterned photoresist layer, and, for example, independent of any effect that of any of the photoacid generator, photobase generator, pH buffer and hexamethyldisalizane might have. Other preferred attributes are as described above.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming a patterned photoresist layer over a semiconductor substrate, comprising:
   forming a porous antireflective coating over a semiconductor substrate;
   providing a photoresist footer-reducing fluid within pores of the porous antireflective coating;
   forming a positive photoresist over the porous antireflective coating having the fluid therein; and
   patterning and developing the positive photoresist to form a patterned photoresist layer, the fluid within the pores being effective to reduce photoresist footing in the patterned positive photoresist layer than would otherwise occur in the absence of the fluid within the pores.

2. The method of claim 1 wherein the porous antireflective coating is provided to a thickness of from about 100 Angstroms to about 5000 Angstroms.

3. The method of claim 1 wherein the porous antireflective coating is organic.

4. The method of claim 3 wherein the organic porous antireflective coating comprises an acrylate polymer.

5. The method of claim 1 wherein the porous antireflective coating is inorganic.

6. The method of claim 5 wherein the inorganic porous antireflective coating comprises $Si_xO_yN_z$.

7. The method of claim 1 wherein the porous antireflective coating comprises an oxide.

8. The method of claim 1 wherein the porous antireflective coating comprises $SiO_2$.

9. The method of claim 1 wherein the footer-reducing fluid is primarily gaseous.

10. The method of claim 1 wherein the footer-reducing fluid is primarily liquid.

11. The method of claim 1 wherein the footer-reducing fluid comprises a photoacid generator.

12. The method of claim 1 wherein the footer-reducing fluid comprises an acid pH buffer.

13. The method of claim 12 wherein the acid pH buffer comprises 2-(N-Morpholino) ethanesulfonic acid.

14. The method of claim 1 wherein providing the footer-reducing fluid within the pores occurs after forming the porous antireflective coating over the substrate.

15. The method of claim 14 wherein the footer-reducing fluid is primarily liquid, the providing of the footer-reducing fluid within the pores comprising soaking the substrate with porous antireflective coating within a bath containing the footer-reducing liquid.

16. The method of claim 14 wherein the footer-reducing fluid is primarily liquid, the providing of the footer-reducing fluid within the pores comprising puddling the liquid onto the porous antireflective coating.

17. The method of claim 14 wherein the footer-reducing fluid is primarily gaseous, the providing of the footer-reducing fluid within the pores comprising exposing the substrate with porous antireflective coating to an environment comprising the gas.

18. The method of claim 1 wherein providing the footer-reducing fluid within the pores occurs during forming of the porous antireflective coating over the substrate.

19. The method of claim 18 wherein the footer-reducing fluid is primarily gaseous.

20. The method of claim 19 wherein the forming of the porous antireflective coating is by chemical vapor deposition.

21. A method of forming a patterned photoresist layer over a semiconductor substrate, comprising:
    forming a porous antireflective coating over a semiconductor substrate;
    providing a photoresist base-widening fluid within pores of the porous antireflective coating;
    forming a positive photoresist over the porous antireflective coating having the fluid therein; and
    patterning and developing the positive photoresist to form a patterned photoresist layer, the fluid within the pores being effective to widen a base of the patterned positive photoresist adjacent the antireflective coating than would otherwise occur in the absence of the fluid within the pores.

22. The method of claim 21 wherein the base-widening fluid comprises a photobase generator.

23. The method of claim 21 wherein the base-widening fluid comprises a basic pH buffer.

24. The method of claim 23 wherein the basic pH buffer comprises triethanolamine.

25. The method of claim 21 wherein the base-widening fluid is primarily gaseous.

26. The method of claim 21 wherein the base-widening fluid is primarily liquid.

27. The method of claim 21 wherein providing the base-widening fluid within the pores occurs after forming the porous antireflective coating over the substrate.

28. The method of claim 27 wherein the base-widening fluid is primarily liquid, the providing of the base-widening fluid within the pores comprising soaking the substrate with porous antireflective coating within a bath containing the base-widening liquid.

29. The method of claim 27 wherein the base-widening fluid is primarily liquid, the providing of the base-widening fluid within the pores comprising puddling the liquid onto the porous antireflective coating.

30. The method of claim 27 wherein the footer-reducing fluid is primarily gaseous, the providing of the footer-reducing fluid within the pores comprising exposing the substrate with porous antireflective coating to an environment comprising the gas.

31. The method of claim 21 wherein providing the base-widening fluid within the pores occurs during forming of the porous antireflective coating over the substrate.

32. The method of claim 31 wherein the base-widening fluid is primarily gaseous.

33. The method of claim 32 wherein the forming of the porous antireflective coating is by chemical vapor deposition.

34. The method of claim 21 wherein the porous antireflective coating is organic.

35. The method of claim 34 wherein the organic porous antireflective coating comprises an acrylate polymer.

36. The method of claim 21 wherein the porous antireflective coating is inorganic.

37. The method of claim 36 wherein the inorganic porous antireflective coating comprises $Si_xO_yN_z$.

38. A method of forming a patterned photoresist layer over a semiconductor substrate, comprising:
    forming a porous antireflective coating over a semiconductor substrate;
    providing a liquid-comprising material within pores of the porous antireflective coating;
    forming photoresist over the porous antireflective coating having the liquid-comprising material therein; and
    patterning and developing the photoresist over the porous antireflective coating having the liquid-comprising material therein to form a patterned photoresist layer.

39. The method of claim 38 wherein the photoresist comprises a positive photoresist.

40. The method of claim 38 wherein the photoresist comprises a negative photoresist.

41. The method of claim 38 wherein the liquid comprises at least one of a photoacid generator, a photobase generator, a pH buffer, and hexamethyldisalizane.

42. The method of claim 38 wherein the liquid comprises at least two of a photoacid generator, a photobase generator, a pH buffer, and hexamethyldisalizane.

43. The method of claim 38 wherein the liquid comprises at least three of a photoacid generator, a photobase generator, a pH buffer, and hexamethyldisalizane.

44. The method of claim 43 wherein the porous antireflective coating is organic.

45. The method of claim 44 wherein the organic porous antireflective coating comprises an acrylate polymer.

46. The method of claim 38 wherein the porous antireflective coating is inorganic.

47. The method of claim 46 wherein the inorganic porous antireflective coating comprises $Si_xO_yN_z$.

48. The method of claim 38 wherein the porous antireflective coating comprises an oxide.

49. The method of claim 38 wherein the porous antireflective coating comprises $SiO_2$.

50. A method of forming a patterned photoresist layer over a semiconductor substrate, comprising:
    forming a porous antireflective coating over a semiconductor substrate;
    providing a fluid within pores of the porous antireflective coating; the fluid comprising at least one of a photoacid generator, a photobase generator, a pH buffer, and hexamethyldisalizane;
    forming photoresist over the porous antireflective coating having the fluid therein; and
    patterning and developing the photoresist over the porous antireflective coating having the fluid therein to form a patterned photoresist layer.

51. The method of claim 50 wherein the photoresist comprises a positive photoresist.

52. The method of claim 50 wherein the photoresist comprises a negative photoresist.

53. The method of claim 50 wherein the fluid comprises a photoacid generator.

54. The method of claim 50 wherein the fluid comprises a photobase generator.

55. The method of claim 50 wherein the fluid comprises a pH buffer.

56. The method of claim 50 wherein the fluid comprises hexamethyldisalizane.

57. The method of claim 50 wherein the fluid comprises at least two of a photoacid generator, a photobase generator, a pH buffer, and hexamethyldisalizane.

58. The method of claim 57 wherein the fluid comprises at least three of a photoacid generator, a photobase generator, a pH buffer, and hexamethyldisalizane.

59. The method of claim 50 wherein the porous antireflective coating is organic.

60. The method of claim 59 wherein the organic porous antireflective coating comprises an acrylate polymer.

61. The method of claim 50 wherein the porous antireflective coating is inorganic.

62. The method of claim 61 wherein the inorganic porous antireflective coating comprises $Si_xO_yN_z$.

63. The method of claim 50 wherein the porous antireflective coating comprises an oxide.

64. The method of claim 50 wherein the porous antireflective coating comprises $SiO_2$.

* * * * *